United States Patent
Ladvánszky et al.

(10) Patent No.: US 11,177,989 B2
(45) Date of Patent: Nov. 16, 2021

(54) METHODS AND APPARATUS FOR SIGNAL DEMODULATION

(71) Applicant: Telefonaktiebolaget LM Ericsson (publ), Stockholm (SE)

(72) Inventors: János Ladvánszky, Pomaz (HU); Benedek Kovács, Budapest (HU)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 16/967,168

(22) PCT Filed: Mar. 1, 2018

(86) PCT No.: PCT/SE2018/050198
§ 371 (c)(1),
(2) Date: Aug. 4, 2020

(87) PCT Pub. No.: WO2019/168452
PCT Pub. Date: Sep. 6, 2019

(65) Prior Publication Data
US 2021/0075656 A1 Mar. 11, 2021

(51) Int. Cl.
*H04L 27/22* (2006.01)
*H04L 7/033* (2006.01)
*H03L 7/093* (2006.01)

(52) U.S. Cl.
CPC ............ *H04L 27/22* (2013.01); *H04L 7/0331* (2013.01); *H03L 7/093* (2013.01)

(58) Field of Classification Search
CPC ... H04L 27/2275; H04L 27/22; H04L 7/0331; H03L 7/093
See application file for complete search history.

(56) References Cited

U.S. PATENT DOCUMENTS

| | | | | |
|---|---|---|---|---|
| 4,348,641 A | * | 9/1982 | Scott | H04L 27/2273 329/302 |
| 5,081,652 A | * | 1/1992 | Farahati | H04L 27/2272 329/306 |

(Continued)

FOREIGN PATENT DOCUMENTS

| | | |
|---|---|---|
| EP | 0400782 A2 | 12/1990 |
| EP | 0496621 A2 | 7/1992 |
| WO | 9703509 A1 | 1/1997 |

OTHER PUBLICATIONS

PCT International Search Report and Written Opinion dated Nov. 22, 2018 for International Application PCT/SE2018/050198, 13 pages.

(Continued)

*Primary Examiner* — Qutbuddin Ghulamali
(74) *Attorney, Agent, or Firm* — Sage Patent Group

(57) ABSTRACT

A demodulation system for demodulating an input signal is provided. The input signal includes a carrier wave modulated with data symbols selected from a plurality of candidate complex symbol values. The system includes a carrier recovery module, operative to compensate for a carrier frequency of the carrier wave and output a demodulated data signal. The carrier recovery module includes: a first complex-signal conversion module, operative to convert the input signal into a complex-valued input signal; a voltage-controlled oscillator; a mixer, for mixing the complex-valued input signal and a complex-valued output signal of the voltage-controlled oscillator, and generating a mixer output signal; a low-pass filter, coupled to the mixer, operative to filter the carrier frequency from the mixer output signal, and output a signal corresponding to the demodulated data signal; and a folding module, operative to apply a folding algorithm to the output signal of the low-pass filter.

17 Claims, 5 Drawing Sheets

(56) References Cited

U.S. PATENT DOCUMENTS

| | | | | |
|---|---|---|---|---|
| 5,414,735 A | * | 5/1995 | Whikehart | H03D 3/009 |
| | | | | 329/304 |
| 2005/0111601 A1 | | 5/2005 | Bock | |
| 2005/0141645 A1 | * | 6/2005 | Kim | H03D 1/24 |
| | | | | 375/326 |
| 2009/0285278 A1 | * | 11/2009 | Mamaril | H04L 25/03057 |
| | | | | 375/235 |

OTHER PUBLICATIONS

Proakis, John G et al., "Digital Communications", Chapter 5—Carrier and Symbol Synchronization, Fifth edition, 2001, pp. 305-310, McGraw-Hill.
Ladvanszky, J. et al., "Mathematical Models and Simulation of 4-QAM Costas Loop", Preprint 2018, 10 pages.

* cited by examiner

METHODS AND APPARATUS FOR SIGNAL DEMODULATION

CROSS-REFERENCE TO RELATED APPLICATIONS

This application is a 35 U.S.C. § 371 national stage application for International Application No. PCT/SE2018/050198, entitled "METHODS AND APPARATUS FOR SIGNAL DEMODULATION", filed on Mar. 1, 2018, the disclosures and contents of which are hereby incorporated by reference in their entireties.

TECHNICAL FIELD

Embodiments of the present disclosure relate to signal demodulation, and particularly to methods and apparatus for demodulating a signal using circuitry based on a phase-locked loop.

BACKGROUND

Phase-locked loops (PLLs) are well known circuits, widely used in modern electronic devices for a variety of purposes. For example, in telecommunications, PLLs are used to demodulate received signals, that is, to extract an original information-bearing signal from a carrier wave. In this context, a PLL can be used to match the phase and frequency of a local voltage-controlled oscillator (VCO) to the carrier frequency and phase of a received signal requiring demodulation.

The basic PLL architecture for signal demodulation comprises a frequency mixer, a low-pass filter, an oscillator (such as a VCO) and a feedback path. The frequency mixer receives an input signal and an output of the oscillator, and outputs a signal equal to the product of those two signals. If the frequency of the oscillator matches the carrier frequency of the input signal, the output of the frequency mixer will be equal to the information-bearing signal and a high-frequency component at double the carrier frequency. This latter component may then be filtered by the low-pass filter in order to recover the information-bearing signal. This information-bearing signal may be integrated or otherwise averaged (e.g. by a loop filter) in order to provide stability to the loop response, and then fed back via the feedback path to control the oscillator.

Various modifications have been proposed to this basic architecture. One well-known modification is known as the Costas loop, proposed by John Costas in the 1950s.

The Costas loop differs from the conventional PLL in that the VCO provides quadrature outputs, i.e. two signals separated in phase by $\pi/2$. These respective quadrature outputs are provided to respective mixers, where they are each mixed with the input signal before being low-pass filtered. These filtered signals are combined in a further mixer, before being used to control the VCO. Thus the Costas loop comprises two separate arms: one for each of the quadrature outputs of the VCO.

One advantage of the Costas loop over conventional PLLs is that, at small deviations, the Costas loop error voltage varies as a function of $\sin(2\Delta\theta)$ as compared to $\sin(\Delta\theta)$, wherein $\Delta\theta$ is the phase difference between the input signal and the oscillator output signal. Thus the Costas loop is more sensitive to changes in frequency than the conventional PLL. However, the loop also suffers from relatively high symbol error rate in the presence of noise. Alternative circuitry which results in a lower symbol error rate would be beneficial.

SUMMARY

Embodiments of the present disclosure seek to address these and other problems.

In one aspect, there is provided a demodulation system for demodulating an input signal. The input signal comprises a carrier wave modulated with data symbols selected from a plurality of candidate complex symbol values. The system comprises: an input, for receiving the input signal to be demodulated; and a carrier recovery module, operative to compensate for a carrier frequency of the carrier wave and output a demodulated data signal. The carrier recovery module comprises: a first complex-signal conversion module, operative to convert the input signal into a complex-valued input signal; a voltage-controlled oscillator; a mixer, for mixing the complex-valued input signal and a complex-valued output signal of the voltage-controlled oscillator, and generating a mixer output signal; a low-pass filter, coupled to the mixer, operative to filter the carrier frequency from the mixer output signal, and output a signal corresponding to the demodulated data signal; and a folding module, operative to apply a folding algorithm to the output signal of the low-pass filter, so as to transform the plurality of candidate complex symbol values to a single value. The voltage-controlled oscillator is controlled as a function of an output of the folding module.

In another aspect, there is provided an apparatus, comprising: an interface for receiving a signal to be demodulated; and a demodulation system as recited above.

A further aspect provides a method for demodulating a input signal. The input signal comprises a carrier wave modulated with data symbols selected from a plurality of candidate complex symbol values. The method comprises: converting the input signal into a complex-valued input signal; mixing the complex-valued input signal and a complex-valued output signal of a voltage-controlled oscillator, and generating a mixer output signal; filtering the carrier frequency from the mixer output signal with a low-pass filter and outputting a signal corresponding to the demodulated data signal; applying a folding algorithm to the output signal of the low-pass filter, using a folding module, so as to transform the plurality of candidate complex symbol values to a single value; and controlling the voltage-controlled oscillator as a function of an output of the folding module.

Embodiments of the disclosure thus provide methods and apparatus for demodulating a received signal, which are robust to noise and which achieve excellent symbol error rate.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The following sets forth specific details, such as particular embodiments for purposes of explanation and not limitation. But it will be appreciated by one skilled in the art that other embodiments may be employed apart from these specific details. In some instances, detailed descriptions of well-known methods, nodes, interfaces, circuits, and devices are omitted so as not obscure the description with unnecessary detail. Those skilled in the art will appreciate that the functions described may be implemented in one or more nodes using hardware circuitry (e.g., analog and/or discrete logic gates interconnected to perform a specialized function, ASICs, PLAs, etc.) and/or using software programs and data in conjunction with one or more digital microprocessors or general purpose computers that are specially adapted to carry out the processing disclosed herein, based on the execution of such programs. Moreover, the technology can additionally be considered to be embodied entirely within any form of computer-readable memory, such as solid-state memory, magnetic disk, or optical disk containing an appropriate set of computer instructions that would cause a processor to carry out the techniques described herein.

Hardware implementation may include or encompass, without limitation, digital signal processor (DSP) hardware, a reduced instruction set processor, hardware (e.g., digital or analog) circuitry including but not limited to application specific integrated circuit(s) (ASIC) and/or field programmable gate array(s) (FPGA(s)), and (where appropriate) state machines capable of performing such functions.

In terms of computer implementation, a computer is generally understood to comprise one or more processors, one or more processing modules or one or more controllers, and the terms computer, processor, processing module and controller may be employed interchangeably. When provided by a computer, processor, or controller, the functions may be provided by a single dedicated computer or processor or controller, by a single shared computer or processor or controller, or by a plurality of individual computers or processors or controllers, some of which may be shared or distributed. Moreover, the term "processor" or "controller" also refers to other hardware capable of performing such functions and/or executing software, such as the example hardware recited above.

Figure 1:
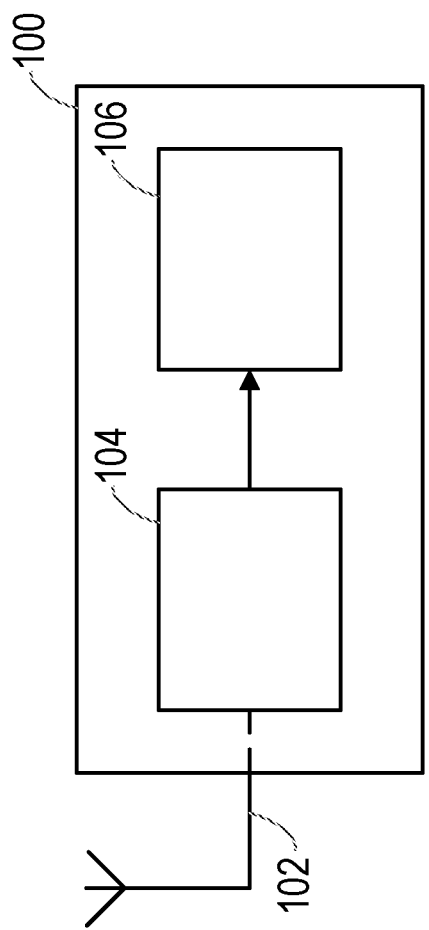
FIG. 1 is a schematic diagram of an apparatus according to embodiments of the disclosure.

FIG. 1 shows an apparatus 100 according to embodiments of the disclosure. In the illustrated embodiment, the apparatus 100 comprises a wireless receiver, operative to receive radio-frequency signals transmitted by a radio-frequency transmitter (not shown). In this context, the apparatus 100 may therefore be implemented in a wireless device such as a mobile terminal device or user equipment, or a network node for a wireless communication network, such as a base station, transmission point, eNodeB, gNodeB or any equivalent node. The wireless receiver may implement any wireless radio protocol; the present disclosure is not limited in that respect.

The apparatus 100 comprises one or more antennas 102, a demodulation system 104 and processing circuitry 106. The one or more antennas 102 are operative to detect radio-frequency signals transmitted by one or more radio-frequency transmitters, and to pass the radio-frequency energy to the demodulation system 104 for demodulation.

Those skilled in the art will appreciate that the signals generally comprise a carrier wave which is modulated with an information-bearing signal. One well-known modulation technique is known as quadrature amplitude modulation (QAM). According to this technique, data is conveyed in two digital bit streams by modulating the amplitudes of two quadrature components of the carrier wave (i.e. two components having the same carrier frequency and separated in phase by $\pi/2$). The in-phase component is known as the I component; the quadrature component is known as the Q component. The most common QAM scheme is square, with candidate symbol values distributed in a square grid pattern in the IQ plane. Higher-order modulation schemes utilize a greater number of candidate symbol values in the grid. For example, 16-QAM, 64-QAM and 256-QAM are commonly used for wireless communications. In one example, the signal may be modulated with just two bits, i.e. 4-QAM, or quaternary phase shift keying (QPSK). Higher-order modulation schemes may be used for wired applications, where the noise can be expected to be lower.

The demodulation system 104 acts on the radio-frequency energy to recover the information-bearing signal from the modulated carrier wave. Further detail regarding this aspect will be provided below with respect to FIGS. 2 and 3. The information-bearing signal is then passed from the demodulation system 104 to processing circuitry 106, where it can be stored and/or acted upon as necessary. Alternatively, the radio-frequency energy may be mixed to a lower, intermediate frequency prior to demodulation in the demodulation system.

Thus FIG. 1 shows an apparatus 100 in which a demodulation system 104 according to embodiments of the disclosure is used to demodulate wireless received signals.

However, embodiments of the present disclosure are not limited to demodulation of wireless or radio signals. Rather, the concepts disclosed herein may be used to demodulate any modulated signal, particularly those signals modulated using QAM. Thus, in general terms, the apparatus 100 may comprise any suitable interface for receiving signals according to any transport mechanism. The interface may alternatively be wired, operative to receive electronic signals, or electro-optic, and operative to receive optical signals.

Figure 2:
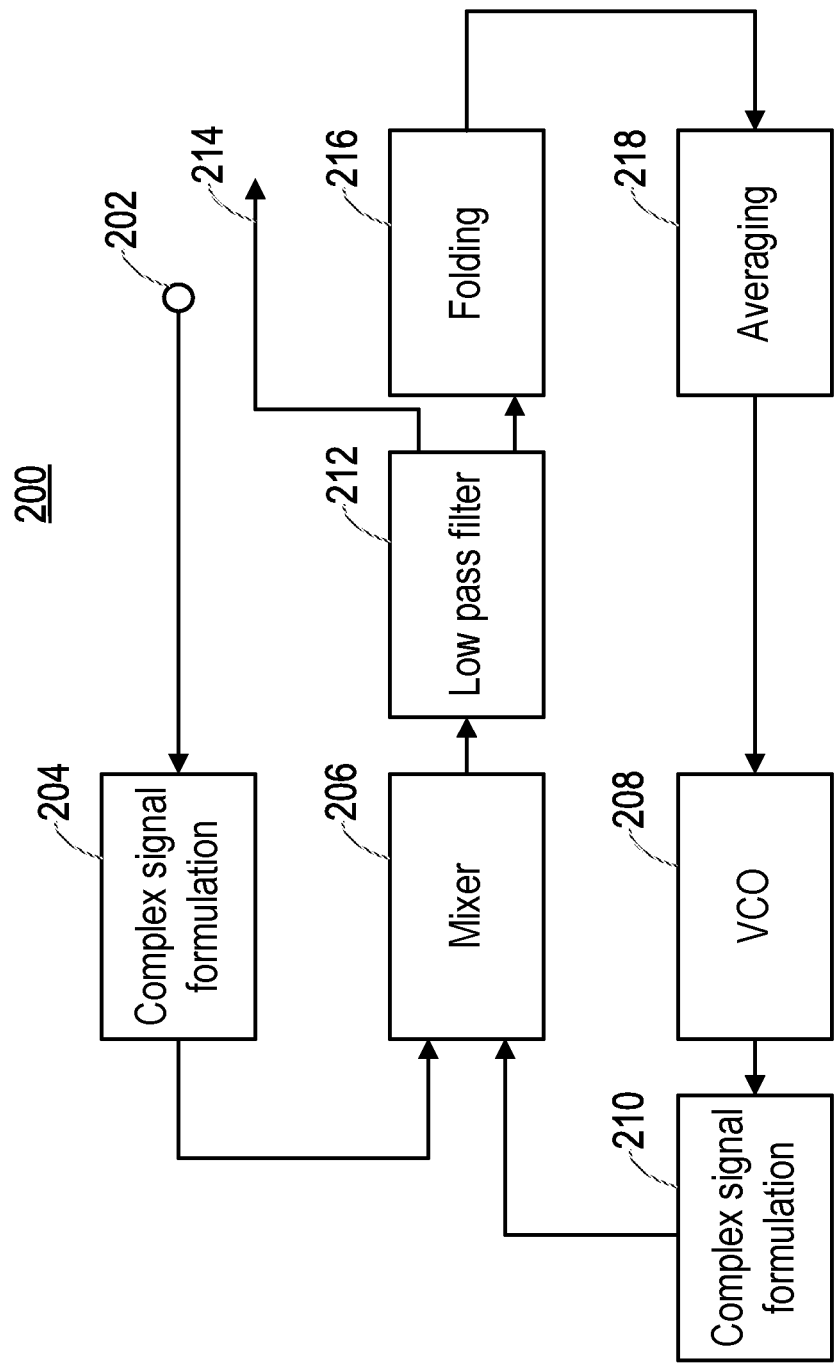
FIG. 2 is a schematic diagram of a demodulation system according to embodiments of the disclosure.

FIG. 2 shows a demodulation system 200 according to embodiments of the disclosure. The demodulation system 200 may be operative as the demodulation system 104 described above with respect to FIG. 1, for example.

The system 200 comprises an input 202, which receives the input signal to be demodulated. As noted above, the input signal generally comprises a carrier wave which is quadrature amplitude modulated with an information-bearing signal. The plurality of candidate symbol values in the input signal are arranged in the complex IQ plane, and may be distributed in a grid pattern for example. The signal may have been transmitted via any transport modality, such as wireless, wired or optical.

The remainder of the features of the demodulation system 200 shown in FIG. 2 form a carrier recovery module, operative to compensate for the carrier frequency of the carrier wave, and to output a demodulated data signal corresponding to the information-bearing signal used to module the carrier wave. As will be seen from the description below, the carrier recovery module is based on the phase-locked loop.

The input signal received at the input 202 is a single, real-valued signal. According to embodiments of the present disclosure, this real-valued signal is converted to a complex-valued signal by a first complex-signal conversion module 204. Various methods exist for converting a real-valued signal to a complex-valued signal. For example, the input signal may be shifted in phase by π/2 (to generate a quadrature component), and then added to the original version to recover the complex-valued signal. If following this method, the resulting signal will have a greater amplitude than the original input signal. Normalization may be used to recover the original amplitude. The phase shift may be implemented in a number of different ways. For example, a Hilbert filter may be used to apply a π/2 phase shift to all Fourier components of the signal. In a narrowband approximation, the phase shift may be implemented by a T/4 delay (where T is the period of the carrier wave).

The complex-valued input signal (i.e. the output of the first complex-signal conversion module 204) is passed to a phase detector or mixer 206. The mixer 206 also receives an output of a voltage-controlled oscillator (VCO) 208.

The VCO 208 is controlled by action of a phase-locked loop, and this will be described in further detail below. As with the input signal, in the illustrated embodiment the output of the VCO 208 is real-valued. This real-valued signal is passed to a second complex-signal conversion module 210, operative to convert the real-valued output of the VCO 208 to a complex-valued signal. The second complex-signal conversion module 210 may operate in a substantially similar way to the first complex-signal conversion module 204. For example, the output signal of the VCO 208 may be shifted in phase by π/2 (to generate a quadrature component), and then added to the original version to recover the complex-valued signal. The phase shift may be implemented in a number of different ways. For example, a Hilbert filter may be used to apply a π/2 phase shift to all Fourier components of the signal. In a narrowband approximation, the phase shift may be implemented by a T/4 delay (where T is the period of the carrier wave).

According to embodiments of the disclosure, the phase shift implemented by the second complex-signal conversion module 210 is in an opposite direction to that implemented by the first complex-signal conversion module 204.

The second complex-signal conversion module 210 may or may not have a normalization function in order to recover the original amplitude of the output signal of the VCO 208. For example, in the latter case, the normalization function may be avoided by controlling the VCO 208 to output a signal having a lower amplitude than would be required in the absence of complex-signal conversion. For example, if the phase shift and combining process described above increases the amplitude by the square root of 2, the amplitude of the VCO signal may be divided by the square root of 2. It will further be understood that precise equivalence between the amplitudes of the input signal and the VCO signal is not necessary for operation of the demodulation system 200 and locking of the phase-locked loop.

The mixer 206 thus receives the complex-valued input signal from the module 204, and also receives the complex-valued VCO output signal from the module 210. The mixer 206 may be implemented as a product detector, operative to multiply the two signals together. In this case, and particularly in the steady state once the output of the VCO 208 is locked in phase and frequency with the carrier frequency of the input signal, the output of the mixer 206 comprises two components: a component equal to the information-bearing signal (possibly with a DC offset); and a component having a frequency equal to twice the carrier frequency. As the VCO signal is phase-shifted in an opposite direction to the input signal, the output of the mixer 206 is a standing (i.e. non-rotating) signal. In this way, the demodulation system 200 is robust to noise.

This output signal is passed to a low-pass filter 212, which acts to filter the high-frequency component, thus removing the carrier wave from the signal and recovering the information-bearing signal (i.e. the demodulated data signal). For example, the low-pass filter may implement a cut-off frequency which falls between the modulation frequency and twice the carrier frequency.

The low-pass filter 212 thus outputs a signal which is equal to the demodulated data signal. This signal is provided as an output signal 214 of the demodulation system 200 (e.g. provided to processing circuitry 106).

The demodulated data signal is also used in the phase-locked loop to control the VCO 208. Thus, according to embodiments of the disclosure, the demodulated data signal is passed to a folding module 216 which is operative to apply a folding algorithm to the signal.

The folding algorithm is operative to apply one or more successive folds and/or one or more successive shifts to the complex plan of the signal, so as to transform all possible candidate symbol values of the demodulated signal to a single value. This algorithm will be described in greater detail with respect to FIGS. 3 and 4. However, by altering the signal so that all candidate symbol values have the same, single value, the data component of the demodulated signal is effectively removed. Thus the output of the folding module 216 is a signal in which both the carrier wave (by action of the low-pass filter 212) and the information have been removed. Thus the output should be small, and equivalent to the instantaneous difference in frequencies of the VCO output signal and the carrier frequency of the input signal.

By utilizing a folding algorithm to effectively remove the information from the demodulated data signal, the system 200 averages the noise. That is, each constellation point or candidate symbol value has its own respective contribution to the overall noise. By folding the constellation diagram to superpose all candidate symbol values at the same value, these respective noise contributions are summed, and averaged (reduced). Thus the folding algorithm is particularly robust to noise.

This signal may be used directly in a feedback loop to control the VCO so as to change its frequency and attempt to correct for that frequency difference. However, such a loop is likely to be unstable. Thus, in the illustrated embodiment, the output of the folding module 216 is passed to an averaging module 218 which is operative to average the output of the folding module 216 over a finite time period or window. The averaging module 216 may be implemented as a low-pass filter or other loop filter. This averaged signal (the output of the averaging module 218) may then be used to control the VCO 208. As the output of the averaging module 218 can be expected to vary less rapidly than the output of the folding module 216, control of the VCO 208 is more stable.

The demodulation system 200 described above, owing to is use of complex-valued signals and a folding algorithm to remove the data component from the demodulated data signal, achieves an extremely low symbol error rate even in the presence of significant noise. Based on simulations, the error rate has been shown to equal 0.01 (that is, one error in every 100 bits) at −5 dB signal-to-noise ratio.

Figure 3:
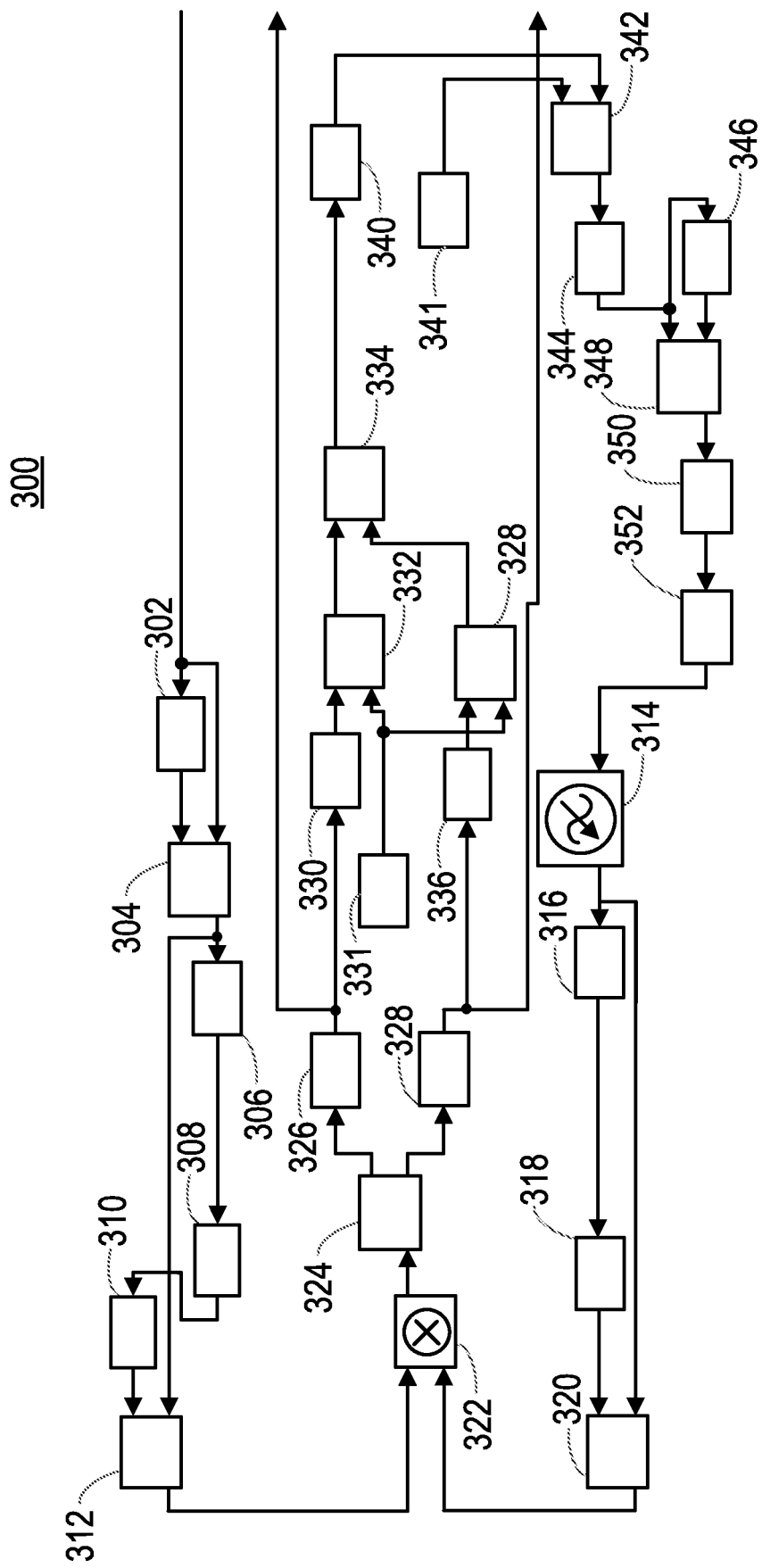
FIG. 3 is a schematic diagram of a demodulation system according to further embodiments of the disclosure.

FIG. 3 shows a demodulation system 300 according to further embodiments of the disclosure. The demodulation system 300 is similar to the demodulation system 200 described above with respect to FIG. 2, but provides further detail on the operation of each module.

Thus the input signal is passed to a first complex-signal conversion module. In the illustrated embodiment, the first complex-signal conversion module comprises a quarter-wave phase shift element 302, which shifts the phase of the input signal by π/2.

In the illustrated this phase shift element is implemented with a delay line 302, providing a delay equal to T/4 (where T is the period of the carrier wave). Alternatively, the phase-shift element 302 may be implemented with a Hilbert filter. The output of the phase-shift element is provided to a combining module 304, which combines it with the original input signal to generate a complex-valued signal.

However, this signal will have a greater amplitude than the original input signal, and thus in the illustrated embodiment a process of normalization is applied to recover the original amplitude. A normalizing module 306 determines the square of the absolute values of the complex-valued signal, while a square root module 308 determines the square root of this value. The (real-valued) square root is converted to a complex value in the real-to-complex module 310, before being passed to a dividing module 312 which divides the output of the combining module 304 by the output of the real-to-complex module 310. The output of the dividing module 312 is thus a normalized, complex-valued version of the input signal.

The demodulation system further comprises a VCO 314, which is controlled to output an oscillating signal at a particular frequency. In the steady state, when the feedback loop is locked to the frequency of the input signal, the quiescent frequency of the VCO is equal to the carrier frequency of the input signal.

This oscillating signal is passed to a second complex-signal conversion module, which is operative to convert it to a complex-valued signal. The second complex-signal conversion module comprises a quarter-wave phase shift element 316, which shifts the phase of the VCO output signal by π/2. In the illustrated this phase shift element is implemented with a delay line 316, providing a delay equal to T/4 (where T is the period of the carrier wave). Alternatively, the phase-shift element 316 may be implemented with a Hilbert filter. The output of the phase-shift element is provided to a scaling module 318, which changes the sign of the quadrature component (e.g. by implementing a multiplication by −1), so that the rotation applied by the second complex-signal conversion module is in an opposite direction to the rotation applied by the first complex-signal conversion module. The output of the scaling module 318 and the VCO output signal are provided to a combiner 320, which generates a complex-valued signal in which the VCO output signal is the in-phase component and the output of the scaling module 318 is the quadrature component.

The complex-valued signals output from the dividing module 312 and the combining module 320 are provided to a mixer 322, which in the illustrated embodiment is implemented as a complex product detector, operative to multiply the two complex-valued signals together. This product signal is provided to a conversion module 324, which outputs separate signals corresponding to the real and imaginary (I and Q) components of that product signal. These signals are provided to respective low-pass filters 326 and 328, which filter the high-frequency Fourier components from each signal (corresponding to the carrier wave). For example, the low-pass filters 326 and 328 may implement cut-off frequencies between the modulation frequency and twice the carrier frequency. The outputs of these low-pass filters 326 and 328 correspond to the demodulated I and Q data components, the information-bearing components of the input signal, and are output from the demodulation system 300 (e.g. to the processing circuitry 106).

As noted above, the demodulated data signals are also subject to a folding algorithm to transform all possible candidate symbol values to a single value. In the illustrated embodiment, the input signal is modulated with 4-QAM. Thus the folding module is operative to implement two folds, about the I and Q axes, to transform all four candidate symbol values to a single value. One or more shifts are also applied such that the single value is equal to zero. In higher-order modulation schemes, such as 16-QAM or higher, one or more shifts are also required between folds, so as to transform all possible candidate symbol values to a single value. This aspect is shown in FIG. 4 below.

The in-phase component output from the low-pass filter 326 is passed to an absolute module 330, which determines the absolute value of the component (thus implementing a fold about the I axis), and is then subject to a shift in an adding module 332. In the When the loop is perfectly locked to the carrier frequency, the output of the adding module 332 should be equal to zero whatever the actual value of the I component in the demodulated data signal. Similar processes are carried out on the Q component by a respective absolute module 336 and a respective adding module 338. The outputs of the adding modules 332, 338 are provided to a combining module 334, which converts them to a complex-valued output signal.

A magnitude module 340 determines the magnitude of this complex-valued signal, and this magnitude is subject to a further shift in an adding module 342 such that the new constellation diagram (after the folds realized in modules 330 to 338) is symmetric with respect to the origin.

Thus the output of the adding module 342 is equivalent to the instantaneous difference in frequencies of the VCO output signal and the carrier frequency of the input signal.

This signal may be used directly in a feedback loop to control the VCO 314 so as to change its frequency and attempt to correct for that frequency difference. However, as noted above, such a loop is likely to be unstable.

In the illustrated embodiment, the output of the adding module 342 is averaged over a finite time window, by action of the modules 344 to 348. The output of the adding module 342 is passed to an integrating module 344, which sums successive values of the signal to create an integrated value. This value is fed to a difference module 348, together with a version of the signal which is delayed by a delay block 346. The difference module 348 determines the difference between these two signals, thus providing an average of the output of the adding module 342. In the illustrated embodiment, this average value is subject to a scaling factor in scaling module 350, and a delay in delay block 352, before being used as the control input voltage to the VCO 314. By delaying the signal with delay block 352, computational deadlock can be avoided.

In the steady or locked state, the VCO input signal is a small, constant value that corresponds to the difference between the real and ideal quiescent frequencies of the VCO 314.

The circuits described above with respect to FIGS. 2 and 3 frequently show the transfer of complex signals over a single electrical connection. In alternative embodiments, any of these complex signals may be transferred by separate electrical connections for the real and imaginary components.

The example of FIG. 3 shows demodulation of QPSK or 4-QAM signals, in which the folding algorithm comprises two folds (about the I and Q axes) and corresponding shifts to bring the overall value to zero. Those skilled in the art will appreciate that this folding algorithm may be adapted to apply to any square or rectangular QAM scheme. FIGS. 4a to 4g show successive steps in one example of a folding algorithm applied to 16-QAM signals.

Figure 4D:
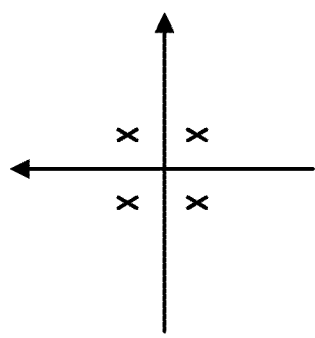
FIGS. 4a to 4g show a folding algorithm according to embodiments of the disclosure.
Figure 4C:
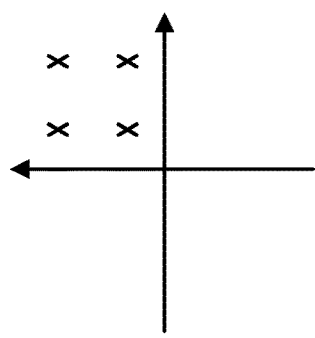
Figure 4G:
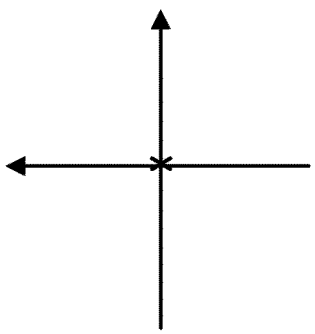
Figure 4B:
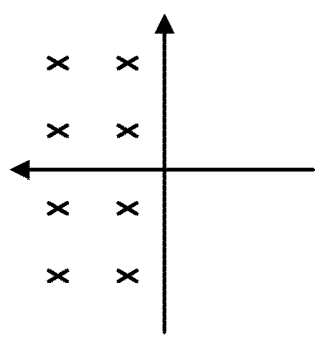
Figure 4F:
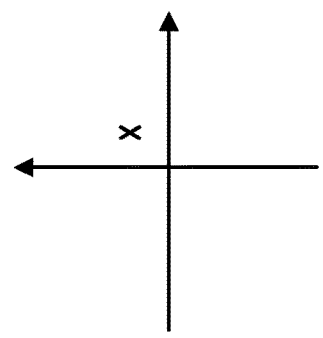
Figure 4A:
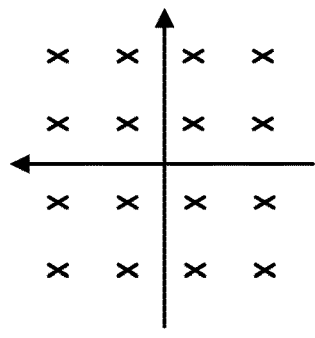

FIG. 4a shows the 16-QAM constellation diagram, in which 16 candidate symbol values are distributed in a grid pattern over the IQ complex plane.

FIG. 4b shows the application of a first fold to that constellation diagram, about the I axis. Thus the eight candidate symbol values with negative Q values are superposed on the eight candidate symbol values with positive Q values.

FIG. 4c shows the application of a second fold, about the Q axis. The remaining four candidate symbol values with negative I values are superposed on the four candidate symbol values with positive I values.

FIG. 4d shows the application of a shift in the I and Q axes, to centre the remaining candidate symbol values about the origin.

Figure 4E:
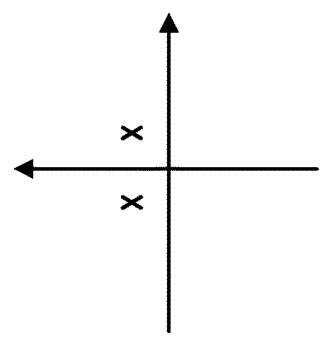

FIG. 4e shows the application of a third fold, about the I axis. Thus the two remaining candidate symbol values with negative Q values are superposed on the two candidate symbol values with positive Q values.

FIG. 4f shows the application of a fourth fold, about the Q axis. The remaining candidate symbol value with a negative I value is superposed on the remaining candidate symbol value with a positive I value.

FIG. 4g shows the application of a second shift in the I and Q axes, to centre the single remaining candidate symbol value on the origin.

Such an algorithm can be straightforwardly implemented with absolute modules and adding modules, as shown above for 4-QAM in FIG. 3. Those skilled in the art will also appreciate that the order of transformations shown in FIGS. 4a to 4g may be changed without substantially affecting the overall algorithm, while alternative transformations may also be applied without substantially affecting the overall algorithm.

Figure 5:
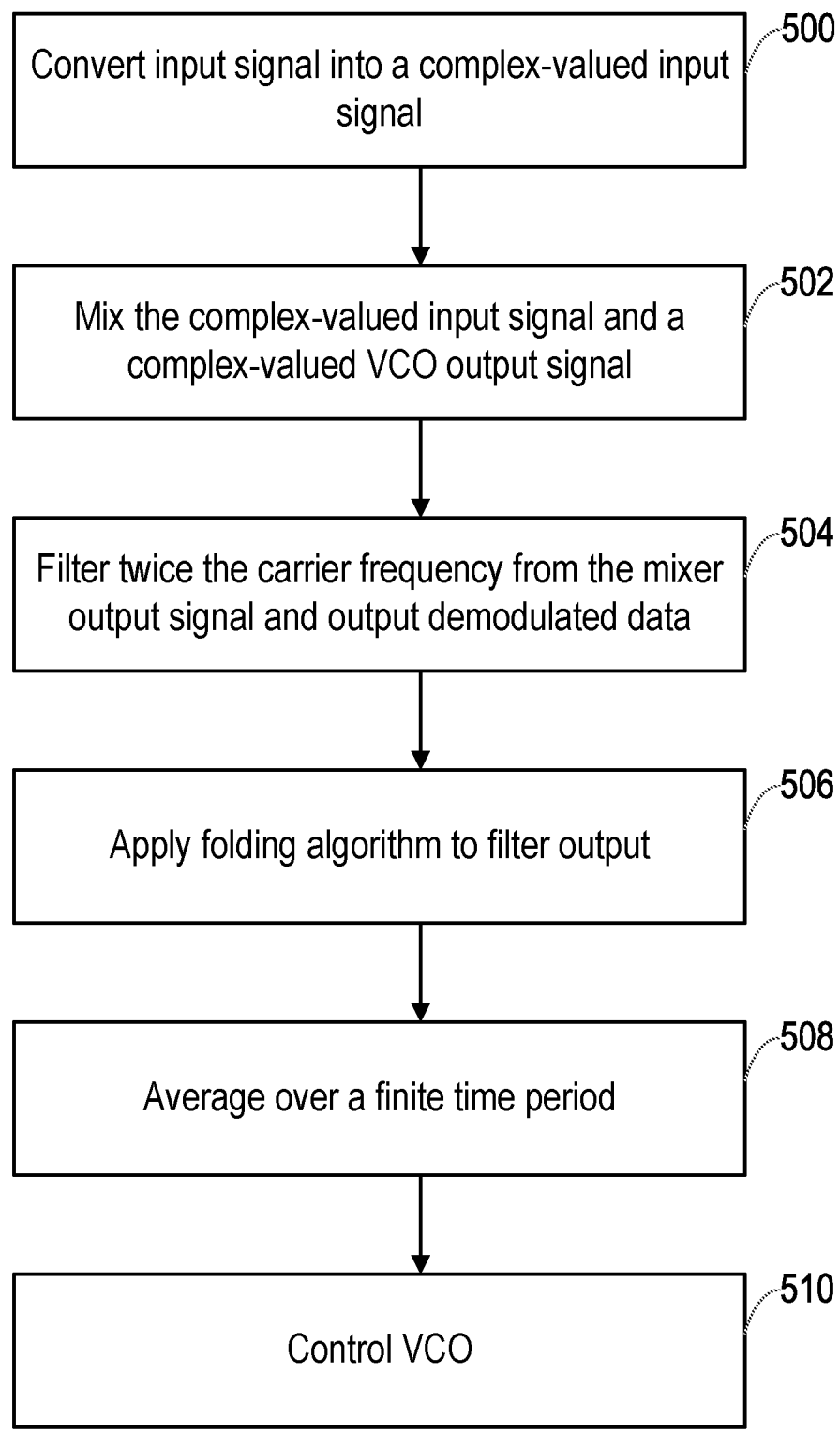
FIG. 5 is a flowchart of a method according to embodiments of the disclosure.

FIG. 5 is a flowchart of a method according to embodiments of the present disclosure. The method may be implemented in circuitry such as that described above with respect to FIGS. 2 and 3, for example.

The method begins in step 500, in which an input signal is converted to a complex-valued input signal. This may be carried out, for example, using the first complex-signal conversion module 204, or the combination of modules 302 to 312 described above. Thus, a quarter wavelength phase shift may be applied to the input signal, before the input signal is combined with its phase-shifted version. The combined signal may be subject to normalization.

In step 502, the complex-valued input signal generated in step 500 is mixed with a complex-valued VCO output signal. The complex-valued VCO output signal may be generated as described above with respect to the second complex-signal conversion module 210, or the combination of modules 316 to 320. Thus, a quarter wavelength phase shift may be applied to the VCO output signal (in an opposite direction to that applied to the input signal in step 500), before the VCO output signal is combined with its phase-shifted version. The step of mixing may be performed by the mixer 206 or 322 described above.

In step 504, the mixer output signal generated in step 502 is subject to filtering in a low-pass filter (such as the any of the filters 212, 326 or 328 described above), to remove the high frequency carrier wave and leave just the demodulated data signal. This demodulated data signal can be provided as an output from the method.

In step 506, the demodulated data signal is also subjected to a folding algorithm, so as to transform the plurality of candidate complex symbol values associated with the input signal to a single value. The folding algorithm may also implement one or more shifts, to reduce the single value to zero, and/or to account for 16-QAM and higher-order modulation schemes. This step may be performed by the folding module 216, or the combination of modules 330 to 342 described above.

In step 508, the output of the folding algorithm (from which the data and carrier wave have been effectively removed) is averaged over a finite time period, or otherwise low-pass filtered. This step may be performed by the averaging module 218, or the combination of modules 344 to 348 described above.

In step 510, the VCO is controlled with the average signal output from step 508.

Embodiments of the present disclosure thus provide apparatus and methods for demodulating input signals. The apparatus and methods comprise the steps of converting the input signals to complex-valued signals prior to mixing with a VCO output signal, and applying a folding algorithm to the demodulated data signal to use as feedback for controlling the VCO. By utilizing both of these steps, embodiments of the disclosure achieve exceptional symbol error rates even in the presence of significant noise.

It will be understood that the detailed examples outlined above are merely examples. According to embodiments of the disclosure, the steps of the method described in FIG. 5 may be presented in a different order to that described herein. Furthermore, additional steps may be incorporated in the method that are not explicitly recited above. Additional circuitry and modules may be incorporated in the apparatus shown in FIG. 1 and the circuits shown in FIGS. 2 and 3.

The invention claimed is:

1. A demodulation system for demodulating an input signal, the input signal comprising a carrier wave modulated with data symbols selected from a plurality of candidate complex symbol values, the system comprising:
   an input, for receiving the input signal to be demodulated; and
   a carrier recovery module, operative to compensate for a carrier frequency of the carrier wave and output a demodulated data signal; and
   wherein the carrier recovery module comprises:
      a first complex-signal conversion module, operative to convert the input signal into a complex-valued input signal;
      a voltage-controlled oscillator;
      a mixer, for mixing the complex-valued input signal and a complex-valued output signal of the voltage-controlled oscillator, and generating a mixer output signal;
      a low-pass filter, coupled to the mixer, operative to filter the carrier frequency from the mixer output signal, and output a signal corresponding to the demodulated data signal; and
      a folding module, operative to apply a folding algorithm to the output signal of the low-pass filter, so as to transform the plurality of candidate complex symbol values to a single value, wherein the folding algorithm comprises one or more successive folds applied to a complex plane in which the plurality of candidate complex symbol values are defined, so as to transform the plurality of candidate complex symbol values into a single value, wherein the folding algorithm further applies one or more shifts to the complex plane, and wherein the voltage-controlled oscillator is controlled as a function of an output of the folding module.

2. The demodulation system according to claim 1, further comprising an averaging module disposed between the output of the folding module and a control input of the voltage-controlled oscillator, operative to average the output of the folding module over a finite time window.

3. The demodulation system according to claim 1, wherein the first complex-signal conversion module comprises a first quarter-wavelength phase shifter, operative to shift the phase of the input signal by a quarter wavelength, and a first add module operative to combine the input signal and the phase-shifted input signal.

4. The demodulation system according to claim 3, wherein the quarter-wavelength phase shifter comprises a Hilbert filter or a delay block.

5. The demodulation system according to claim 3, wherein the first complex-signal conversion module further comprises a normalization block operative to normalize the amplitude of the combination of the input signal and the phase-shifted input signal.

6. The demodulation system according to claim 3, further comprising a second complex-signal conversion module, operative to convert an output of the voltage-controlled oscillator into the complex-valued output signal of the voltage-controlled oscillator.

7. The demodulation system according to claim 6, wherein the second complex-signal conversion module comprises a second quarter-wavelength phase shifter, operative to shift the phase of the output of the voltage-controlled oscillator by a quarter wavelength, and a second add module operative to combine the output of the voltage-controlled oscillator and the phase-shifted output of the voltage-controlled oscillator.

8. The demodulation system according to claim 7, wherein the second quarter-wavelength phase shifter comprises a Hilbert filter or a delay block.

9. The demodulation system according to claim 7, wherein the second quarter-wavelength phase shifter is operative to shift the phase of the output of the voltage-controlled oscillator in an opposite direction to a phase shift applied in the first quarter-wavelength phase shifter.

10. The demodulation system according to claim 1, wherein the low-pass filter has a cut-off frequency at a value which is between a modulation frequency of the input signal and twice the carrier frequency.

11. An apparatus, comprising:
an interface for receiving a signal to be demodulated; and
a demodulation system according to claim 1.

12. A method for demodulating an input signal, the input signal comprising a carrier wave modulated with data symbols selected from a plurality of candidate complex symbol values, the method comprising:
converting the input signal into a complex-valued input signal;
mixing the complex-valued input signal and a complex-valued output signal of a voltage-controlled oscillator, and generating a mixer output signal;
filtering the carrier frequency from the mixer output signal with a low-pass filter and outputting a signal corresponding to the demodulated data signal;
applying a folding algorithm to the output signal of the low-pass filter, using a folding module, so as to transform the plurality of candidate complex symbol values to a single value, wherein the folding algorithm comprises one or more successive folds applied to a complex plane in which the plurality of candidate complex symbol values are defined, so as to transform the plurality of candidate complex symbol values into a single value and wherein the folding algorithm further applies one or more shifts to the complex plane; and
controlling the voltage-controlled oscillator as a function of an output of the folding module.

13. The method according to claim 12, further comprising averaging the output of the folding module over a finite time window, and providing the averaged signal to a control input of the voltage-controlled oscillator.

14. The method according to claim 12, wherein the step of converting the input signal into the complex-valued input signal comprises shifting the phase of the input signal by a quarter wavelength, and combining the input signal and the phase- shifted input signal.

15. The method according to 12, further comprising converting an output of the voltage-controlled oscillator into the complex-valued output signal of the voltage-controlled oscillator.

16. The method according to claim 15, wherein the step of converting an output of the voltage-controlled oscillator into the complex-valued output signal of the voltage-controlled oscillator comprises shifting the phase of the output of the voltage-controlled oscillator by a quarter wavelength, and combining the output of the voltage-controlled oscillator and the phase-shifted output of the voltage-controlled oscillator.

17. The method according to claim 16, wherein the phase of the output of the voltage-controlled oscillator shifted in an opposite direction to the phase of the input signal.

* * * * *